(12) United States Patent
Wang

(10) Patent No.: US 10,204,800 B2
(45) Date of Patent: Feb. 12, 2019

US010204800B2

(54) METHOD FOR IMPROVING THRESHOLD VOLTAGE OF OXIDE SEMICONDUCTOR THIN FILM TRANSISTOR

(71) Applicant: Wuhan China Star Optoelectronics Semiconductor Display Technology Co., Ltd., Wuhan (CN)

(72) Inventor: Xuanyun Wang, Wuhan (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/561,982

(22) PCT Filed: Aug. 18, 2017

(86) PCT No.: PCT/CN2017/098105
§ 371 (c)(1),
(2) Date: Sep. 27, 2017

(65) Prior Publication Data
US 2018/0374713 A1   Dec. 27, 2018

(30) Foreign Application Priority Data
Jun. 21, 2017   (CN) .......................... 2017 1 0477261

(51) Int. Cl.
*H01L 21/463*   (2006.01)
*H01L 29/66*    (2006.01)

(52) U.S. Cl.
CPC ...... *H01L 21/463* (2013.01); *H01L 29/66969* (2013.01)

(58) Field of Classification Search
CPC ..................... H01L 21/463; H01L 29/66969
See application file for complete search history.

(56) References Cited

U.S. PATENT DOCUMENTS

| | | | | |
|---|---|---|---|---|
| 2011/0240991 A1* | 10/2011 | Yamazaki | ........... | H01L 29/7831 257/43 |
| 2013/0056724 A1 | 3/2013 | Chae et al. | | |
| 2014/0042443 A1* | 2/2014 | Yamazaki | ........... | H01L 27/0733 257/57 |
| 2016/0095206 A1* | 3/2016 | Lai | ....................... | H05K 1/0271 362/97.1 |

FOREIGN PATENT DOCUMENTS

CN    106328693 A    1/2017

* cited by examiner

*Primary Examiner* — Karen Kusumakar
(74) *Attorney, Agent, or Firm* — Leong C. Lei

(57) ABSTRACT

The invention provides a method for improving threshold voltage of oxide semiconductor TFT, by bending the oxide semiconductor TFT for a default number of times or bending the oxide semiconductor TFT for a default duration, by bending the oxide semiconductor TFT to compress or stretch the oxide semiconductor layer to change the distance among the atoms in the channel of the oxide semiconductor TFT so as to change the energy difference between the inter-atom bonding orbital and anti-bonding orbital, resulting in controlling the threshold voltage of the oxide semiconductor TFT within a proper range to achieve improving the threshold voltage of the oxide semiconductor TFT.

19 Claims, 4 Drawing Sheets

```
┌─────────────────────────────────────────────────┐
│ providing an oxide semiconductor TFT, comprising: a gate, │
│ a gate insulating layer covering the gate, an oxide      │
│ semiconductor layer disposed on the gate insulating layer,│ ─── S1
│ and a source and a drain disposed on the oxide           │
│ semiconductor layer spaced form each other with an interval;│
└─────────────────────────────────────────────────┘
                      │
                      ▼
┌─────────────────────────────────────────────────┐
│ performing a default number of bending operations on the │
│ oxide semiconductor TFT, or performing a bending         │
│ operation on the oxide semiconductor TFT for a default   │ ─── S2
│ duration; the bending operation compressing or stretching│
│ the oxide semiconductor layer to improve the threshold   │
│ voltage of the oxide semiconductor TFT.                  │
└─────────────────────────────────────────────────┘
```

METHOD FOR IMPROVING THRESHOLD VOLTAGE OF OXIDE SEMICONDUCTOR THIN FILM TRANSISTOR

BACKGROUND OF THE INVENTION

1. Field of the Invention

The present invention relates to the field of display techniques, and in particular to a method for improving threshold voltage of oxide semiconductor thin film transistor (TFT).

2. The Related Arts

The organic light-emitting display (OLED) devices have the advantages of active-luminous, no need of backlight, high contrast, thinness, wide viewing angle, fast response, ability to realize flexible display, wide temperature range, simple manufacturing process, are considered the emerging applications technology for the next generation display devices.

A flexible display device refers to the use of flexible substrate to make the display device, which is foldable and easy to carry which the traditional flat panel display device is unable achieve, and provides cost and user experience advantages. Thus, the flexible display device has become a mainstream research and development area in display technology.

The OLED display is currently the most suitable for the production of flexible display device. Like the traditional flat-panel display devices, the flexible OLED display devices also need TFT to control the operation of the pixels or to drive pixels. Based on the active layer, the commonly used TFT can be divided into amorphous silicon (a-Si), polysilicon (poly-Si), oxide semiconductor (oxide) and other types.

At present, the most commonly used TFT in flexible OLED display devices is still the low temperature polysilicon (LTPS) TFT. However, the oxide semiconductor has a higher electron migration rate than that of the amorphous silicon and has a simpler manufacturing process compared with LTPS, so the application in flexible display device still attracts attention, has a good application prospect, and is currently a industry research hot topic. However, the application and development of oxide semiconductors still face many issues, such as, indium gallium zinc oxide (IGZO) is an oxide semiconductor comprising In, Ga and Zn with a carrier concentration less than $10^{18}/cm^3$. But the channel layer manufactured by IGZO production is usually amorphous, so the defects in the structure of the material is more and the material is more vulnerable to the environment influence, resulting in lower stability of the TFT and more serious issue in threshold voltage drift, which hinders the application and development of oxide semiconductors.

SUMMARY OF THE INVENTION

The object of the present invention is to provide a method for improving the threshold voltage of oxide semiconductor TFT, able to change the distance among the atoms in the channel of the oxide semiconductor TFT, leading to improving the threshold voltage of oxide semiconductor TFT.

To achieve the above object, the present invention provides a method for improving threshold voltage of oxide semiconductor TFT, comprising the steps of:

Step 1: providing an oxide semiconductor thin film transistor (TFT), comprising: a gate, a gate insulating layer covering the gate, an oxide semiconductor layer disposed on the gate insulating layer, and a source and a drain disposed on the oxide semiconductor layer spaced form each other with an interval;

Step 2: performing a default number of bending operations on the oxide semiconductor TFT, or performing a bending operation on the oxide semiconductor TFT for a default duration; the bending operation compressing or stretching the oxide semiconductor layer to improve the threshold voltage of the oxide semiconductor TFT.

According to a preferred embodiment of the present invention, in Step 2, the default number of bending operations is more than or equal to 100,000 times.

According to a preferred embodiment of the present invention, in Step 2, the default duration for the bending operation is longer than or equal to 45 days.

According to a preferred embodiment of the present invention, the oxide semiconductor TFT has a bending radius less than or equal to 3 mm during the bending operation.

According to a preferred embodiment of the present invention, in Step 2, the bending operation stretches the oxide semiconductor layer so that the threshold voltage of the oxide semiconductor TFT is reduced and gradually stabilized.

According to a preferred embodiment of the present invention, in Step 2, the bending operation compresses the oxide semiconductor layer so that the threshold voltage of the oxide semiconductor TFT is increased and gradually stabilized.

According to a preferred embodiment of the present invention, the oxide semiconductor layer is made of indium gallium zinc oxide (IGZO).

According to a preferred embodiment of the present invention, the gate, the source and the drain are made of one or more of the materials of molybdenum (Mo), aluminum (Al), and titanium (Ti).

According to a preferred embodiment of the present invention, the gate insulating layer comprise a silicon nitride layer covering the gate, and a silicon oxide layer covering silicon nitride layer.

According to a preferred embodiment of the present invention, Step 1 further comprises: providing a flexible base, and the oxide semiconductor TFT being disposed on the flexible base.

The present invention also provides a method for improving threshold voltage of oxide semiconductor TFT, comprising the steps of:

Step 1: providing an oxide semiconductor thin film transistor (TFT), comprising: a gate, a gate insulating layer covering the gate, an oxide semiconductor layer disposed on the gate insulating layer, and a source and a drain disposed on the oxide semiconductor layer spaced form each other with an interval;

Step 2: performing a default number of bending operations on the oxide semiconductor TFT, or performing a bending operation on the oxide semiconductor TFT for a default duration; the bending operation compressing or stretching the oxide semiconductor layer to improve the threshold voltage of the oxide semiconductor TFT;

wherein in Step 2, the default number of bending operations being more than or equal to 100,000 times;

wherein in Step 2, the default duration for the bending operation being longer than or equal to 45 days.

wherein the oxide semiconductor TFT having a bending radius less than or equal to 3 mm during the bending operation.

wherein the gate, the source and the drain being made of one or more of the materials of molybdenum (Mo), aluminum (Al), and titanium (Ti).

wherein the gate insulating layer comprising a silicon nitride layer covering the gate, and a silicon oxide layer covering silicon nitride layer.

Compared to the known techniques, the present invention provides the following advantages. The present invention provides a method for improving threshold voltage of oxide semiconductor TFT, by bending the oxide semiconductor TFT for a default number of times or bending the oxide semiconductor TFT for a default duration, by bending the oxide semiconductor TFT to compress or stretch the oxide semiconductor layer to change the distance among the atoms in the channel of the oxide semiconductor TFT so as to change the energy difference between the inter-atom bonding orbital and anti-bonding orbital, resulting in controlling the threshold voltage of the oxide semiconductor TFT within a proper range to achieve improving the threshold voltage of the oxide semiconductor TFT.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
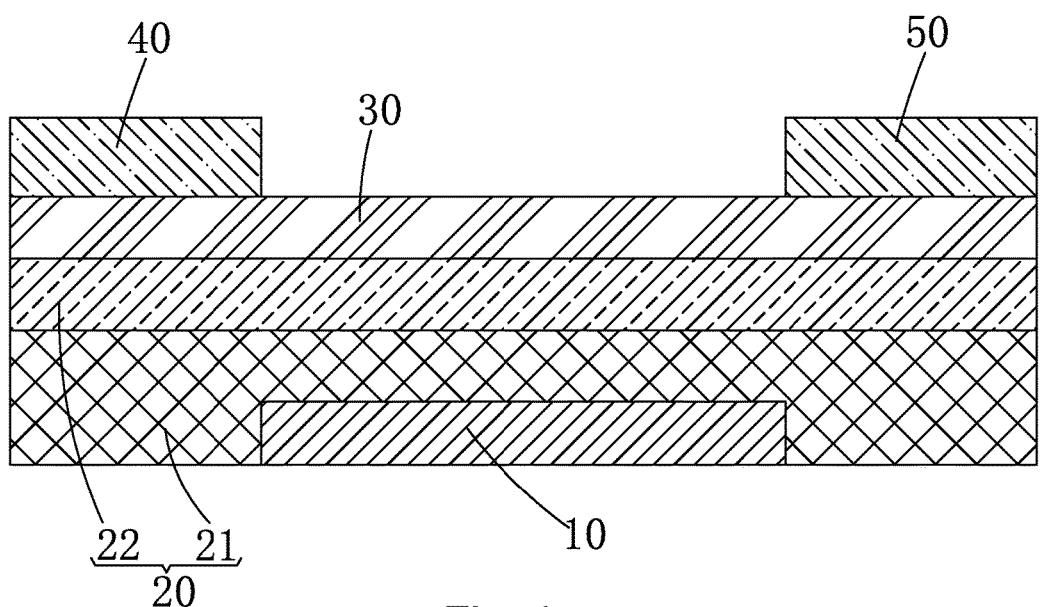
FIG. 1 is a schematic view showing Step 1 of the method for improving threshold voltage of the oxide semiconductor TFT provided by an embodiment of the present invention.
Figure 4:
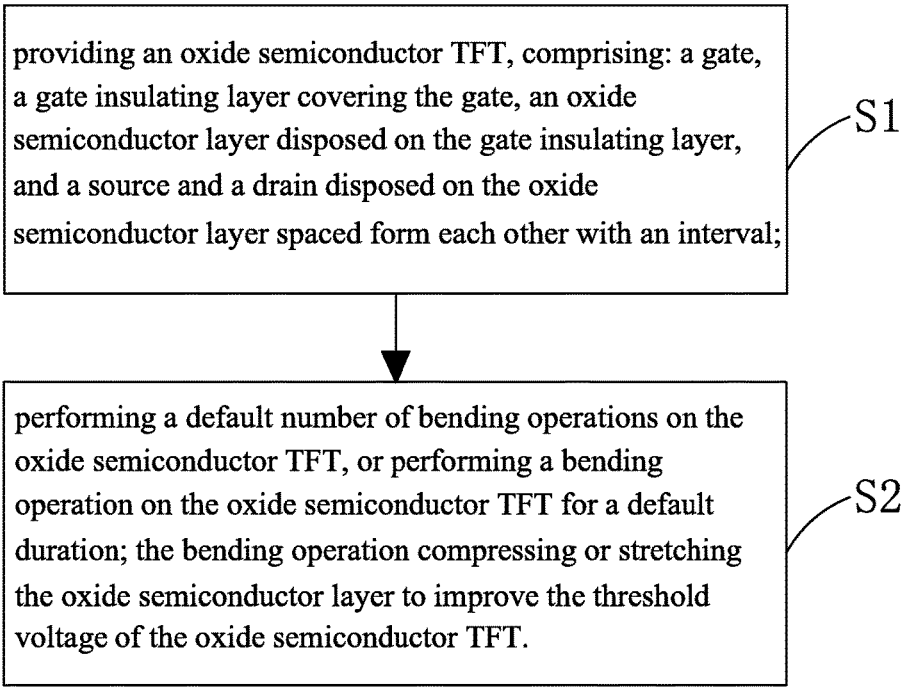
FIG. 4 is a schematic view showing a flowchart of the method for improving threshold voltage of the oxide semiconductor TFT provided by an embodiment of the present invention.

Referring to FIG. 4, the present invention provides a method for improving threshold voltage of oxide semiconductor TFT, comprising the steps of:

Step 1: as shown in FIG. 1, providing an oxide semiconductor thin film transistor (TFT), comprising: a gate 10, a gate insulating layer 20 covering the gate 10, an oxide semiconductor layer 30 disposed on the gate insulating layer 20, and a source 40 and a drain 50 disposed on the oxide semiconductor layer 30 spaced form each other with an interval.

Specifically, Step 1 further comprises: providing a flexible base, and the oxide semiconductor TFT being disposed on the flexible base.

Preferably, the oxide semiconductor layer 30 is made of indium gallium zinc oxide (IGZO). The gate 10, the source 40 and the drain 50 are made of one or more of the materials of molybdenum (Mo), aluminum (Al), and titanium (Ti). The gate insulating layer 20 comprise a silicon nitride layer 21 covering the gate 10, and a silicon oxide layer 22 covering silicon nitride layer 21.

Figure 2:
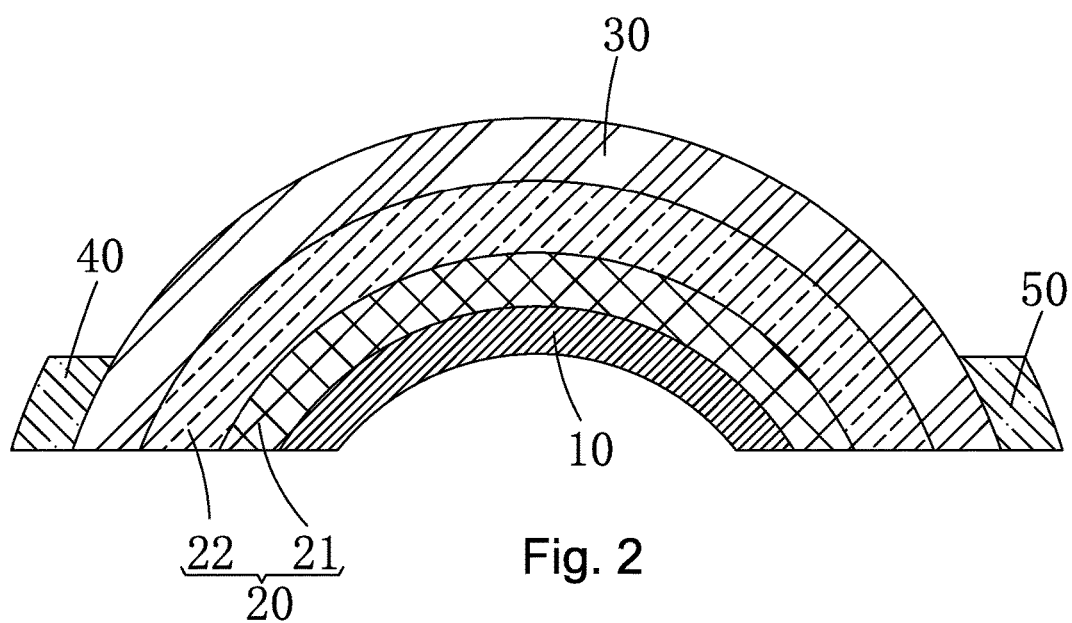
FIG. 2 is a schematic view showing Step 2 of the method for improving threshold voltage of the oxide semiconductor TFT provided by an embodiment of the present invention.
Figure 3:
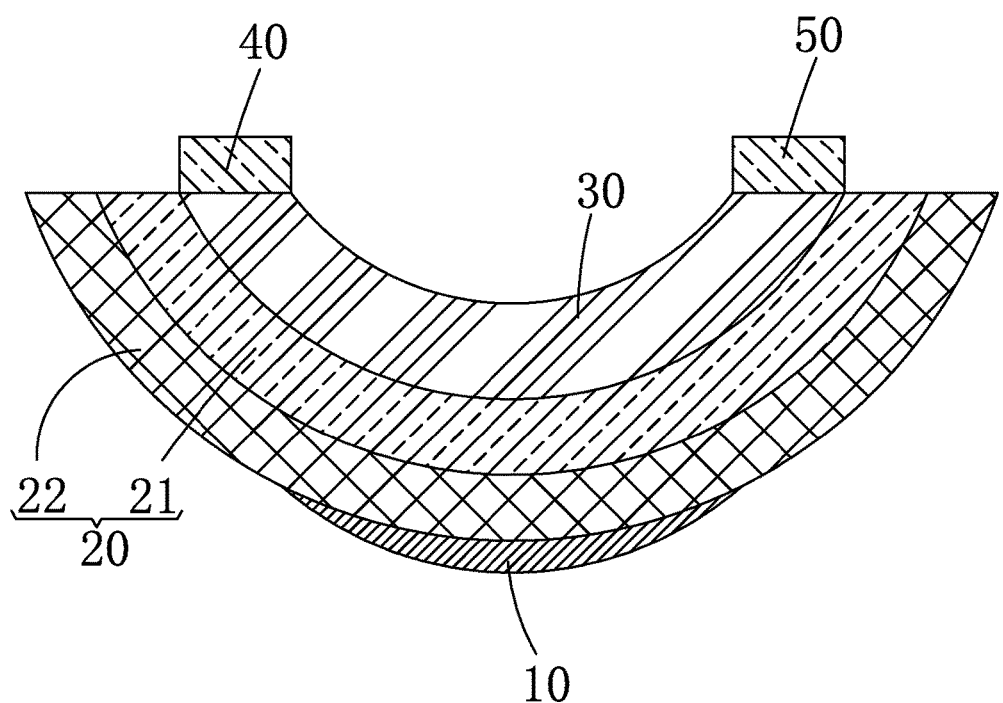
FIG. 3 is a schematic view showing Step 2 of the method for improving threshold voltage of the oxide semiconductor TFT provided by another embodiment of the present invention.

Step 2: as shown in FIG. 2 or FIG. 3, performing a default number of bending operations on the oxide semiconductor TFT, or performing a bending operation on the oxide semiconductor TFT for a default duration. The bending operation compressing or stretching the oxide semiconductor layer 30 to improve the threshold voltage of the oxide semiconductor TFT.

Preferably, in Step 2, the default number of bending operations is 100,000 times. Preferably, in Step 2, the default duration for the bending operation is longer than or equal to 45 days. Specifically, in Step 2, depending on actual needs, the bending operation can be opted to stretch the oxide semiconductor layer 30 so that the threshold voltage of the oxide semiconductor TFT is reduced and gradually stabilized. Alternatively, the bending operation compresses the oxide semiconductor layer 30 so that the threshold voltage of the oxide semiconductor TFT is increased and gradually stabilized; for example, as shown in FIG. 2, in Step 2, by bending the oxide semiconductor TFT towards the gate 10 to stretch the oxide semiconductor layer 30, or, as shown in FIG. 3, in Step 2, by bending the oxide semiconductor TFT away from the gate 10 to compress the oxide semiconductor layer 30.

Specifically, in the first embodiment of the present invention, the oxide semiconductor TFT has a bending radius less than or equal to 3 mm during the bending operation of 100,000 times. By bending the oxide semiconductor TFT to stretch the oxide semiconductor layer 30 to improve the threshold voltage of the oxide semiconductor TFT, the relation between the threshold voltage of the oxide semiconductor TFT and the number of bending operations is shown in Table 1:

TABLE 1 relation between the threshold voltage of the oxide semiconductor TFT and the number of bending operations with 3 mm bending radius.

| Number of bending operations | Threshold voltage |
| --- | --- |
| 0 | 1.06 V |
| 10000 | 1.00 V |
| 30000 | 0.87 V |
| 60000 | 0.75 V |
| 100000 | 0.56 V |

As shown in Table 1, in the first embodiment of the present invention, the threshold voltage of the oxide semiconductor TFT decreases as the number of bending operations increases.

Specifically, in the second embodiment of the present invention, the oxide semiconductor TFT has a bending radius less than or equal to 5 mm during the bending operation of 100,000 times. By bending the oxide semiconductor TFT to stretch the oxide semiconductor layer 30 to improve the threshold voltage of the oxide semiconductor TFT, the relation between the threshold voltage of the oxide semiconductor TFT and the number of bending operations is shown in Table 2:

TABLE 2 relation between the threshold voltage of the oxide semiconductor TFT and the number of bending operations with 5 mm bending radius.

| Number of bending operations | Threshold voltage |
|---|---|
| 0 | 1.06 V |
| 23000 | 1.11 V |
| 60000 | 1.01 V |
| 100000 | 1.04 V |

Comparing Table 1 and Table 2, when the bending radius is 3 mm, the effect of bending on the threshold voltage of the oxide semiconductor TFT is more prominent than the bending radius of 5 mm. As such, the bending operation is preferably to have a bending radius less than or equal to 3 mm when bending the oxide semiconductor TFT.

Specifically, in the third embodiment of the present invention, the oxide semiconductor TFT has a 3 mm bending radius less for 45 days. By bending the oxide semiconductor TFT to stretch the oxide semiconductor layer 30 to improve the threshold voltage of the oxide semiconductor TFT, the relation between the threshold voltage of the oxide semiconductor TFT and the number of days is shown in Table 3:

TABLE 3 relation between the threshold voltage of the oxide semiconductor TFT and the number of days bending operations with 3 mm bending radius.

| Number of days | Threshold voltage |
|---|---|
| 0 | 1.06 V |
| 15 | −0.23 V |
| 22 | −0.37 V |
| 30 | −0.35 V |
| 45 | −0.72 V |

As shown in Table 3, in the third embodiment of the present invention, the threshold voltage of the oxide semiconductor TFT decreases as the number of days increases.

Specifically, in the fourth embodiment of the present invention, the oxide semiconductor TFT has a 5 mm bending radius less for 45 days. By bending the oxide semiconductor TFT to stretch the oxide semiconductor layer 30 to improve the threshold voltage of the oxide semiconductor TFT, the relation between the threshold voltage of the oxide semiconductor TFT and the number of days is shown in Table 4:

TABLE 4 relation between the threshold voltage of the oxide semiconductor TFT and the number of days bendingoperations with 5mm bending radius.

| Number of days | Threshold voltage |
|---|---|
| 0 | 1.06 V |
| 15 | 0.19 V |
| 22 | 0.04 V |
| 30 | 0.09 V |
| 45 | 0.10 V |

Comparing Table 3 and Table 4, when the bending radius is 3 mm, the effect of bending on the threshold voltage of the oxide semiconductor TFT is more prominent than the bending radius of 5 mm. As such, the bending operation is preferably to have a bending radius less than or equal to 3 mm when bending the oxide semiconductor TFT.

It should be noted that the above embodiments perform bending to stretch the oxide semiconductor layer 30. However, the present invention is not restricted to stretching. In other embodiments of the present invention, depending on needs, the present invention can also perform bending to compress the oxide semiconductor layer 30 to achieve improving the threshold of the oxide semiconductor TFT.

In summary, the present invention provides a method for improving threshold voltage of oxide semiconductor TFT, by bending the oxide semiconductor TFT for a default number of times or bending the oxide semiconductor TFT for a default duration, by bending the oxide semiconductor TFT to compress or stretch the oxide semiconductor layer to change the distance among the atoms in the channel of the oxide semiconductor TFT so as to change the energy difference between the inter-atom bonding orbital and antibonding orbital, resulting in controlling the threshold voltage of the oxide semiconductor TFT within a proper range to achieve improving the threshold voltage of the oxide semiconductor TFT.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A method for improving threshold voltage of oxide semiconductor thin film transistor (TFT), comprising the steps of:
   Step 1: providing an oxide semiconductor TFT, comprising: a gate, a gate insulating layer covering the gate, an oxide semiconductor layer disposed on the gate insulating layer, and a source and a drain disposed on the oxide semiconductor layer spaced form each other with an interval;
   Step 2: performing a default number of bending operations on the oxide semiconductor TFT, or performing a bending operation on the oxide semiconductor TFT for a default duration; the bending operation compressing or stretching the oxide semiconductor layer to improve the threshold voltage of the oxide semiconductor TFT;
   wherein in Step 2, the default number of bending operations is more than or equal to 100,000 times.

2. The method for improving threshold voltage of oxide semiconductor TFT as claimed in claim 1, wherein the oxide semiconductor TFT has a bending radius less than or equal to 3 mm during the bending operation.

3. The method for improving threshold voltage of oxide semiconductor TFT as claimed in claim 1, wherein in Step 2, the bending operation stretches the oxide semiconductor layer so that the threshold voltage of the oxide semiconductor TFT is reduced and gradually stabilized.

4. The method for improving threshold voltage of oxide semiconductor TFT as claimed in claim 1, wherein in Step 2, the bending operation compresses the oxide semiconductor layer so that the threshold voltage of the oxide semiconductor TFT is increased and gradually stabilized.

5. The method for improving threshold voltage of oxide semiconductor TFT as claimed in claim 1, wherein the oxide semiconductor layer is made of indium gallium zinc oxide (IGZO).

6. The method for improving threshold voltage of oxide semiconductor TFT as claimed in claim 1, wherein the gate, the source and the drain are made of one or more of the materials of molybdenum (Mo), aluminum (Al), and titanium (Ti).

7. The method for improving threshold voltage of oxide semiconductor TFT as claimed in claim 1, wherein the gate insulating layer comprise a silicon nitride layer covering the gate, and a silicon oxide layer covering silicon nitride layer.

8. The method for improving threshold voltage of oxide semiconductor TFT as claimed in claim 1, wherein Step 1 further comprises: providing a flexible base, and the oxide semiconductor TFT being disposed on the flexible base.

9. A method for improving threshold voltage of oxide semiconductor thin film transistor (TFT), comprising the steps of:
   Step 1: providing an oxide semiconductor TFT, comprising: a gate, a gate insulating layer covering the gate, an oxide semiconductor layer disposed on the gate insulating layer, and a source and a drain disposed on the oxide semiconductor layer spaced form each other with an interval;
   Step 2: performing a default number of bending operations on the oxide semiconductor TFT, or performing a bending operation on the oxide semiconductor TFT for a default duration; the bending operation compressing or stretching the oxide semiconductor layer to improve the threshold voltage of the oxide semiconductor TFT;
   wherein in Step 2, the default number of bending operations being more than or equal to 100,000 times;
   wherein in Step 2, the default duration for the bending operation being longer than or equal to 45 days;
   wherein the oxide semiconductor TFT having a bending radius less than or equal to 3 mm during the bending operation;
   wherein the gate, the source and the drain being made of one or more of the materials of molybdenum (Mo), aluminum (Al), and titanium (Ti);
   wherein the gate insulating layer comprising a silicon nitride layer covering the gate, and a silicon oxide layer covering silicon nitride layer.

10. The method for improving threshold voltage of oxide semiconductor TFT as claimed in claim 9, wherein in Step 2, the bending operation stretches the oxide semiconductor layer so that the threshold voltage of the oxide semiconductor TFT is reduced and gradually stabilized.

11. The method for improving threshold voltage of oxide semiconductor TFT as claimed in claim 9, wherein in Step 2, the bending operation compresses the oxide semiconductor layer so that the threshold voltage of the oxide semiconductor TFT is increased and gradually stabilized.

12. The method for improving threshold voltage of oxide semiconductor TFT as claimed in claim 9, wherein the oxide semiconductor layer is made of indium gallium zinc oxide (IGZO).

13. The method for improving threshold voltage of oxide semiconductor TFT as claimed in claim 9, wherein Step 1 further comprises: providing a flexible base, and the oxide semiconductor TFT being disposed on the flexible base.

14. A method for improving threshold voltage of oxide semiconductor thin film transistor (TFT), comprising the steps of:
   Step 1: providing an oxide semiconductor TFT, comprising: a gate, a gate insulating layer covering the gate, an oxide semiconductor layer disposed on the gate insulating layer, and a source and a drain disposed on the oxide semiconductor layer spaced form each other with an interval;
   Step 2: performing a default number of bending operations on the oxide semiconductor TFT, or performing a bending operation on the oxide semiconductor TFT for a default duration; the bending operation compressing or stretching the oxide semiconductor layer to improve the threshold voltage of the oxide semiconductor TFT;
   wherein in Step 2, the default duration for the bending operation is longer than or equal to 45 days.

15. The method for improving threshold voltage of oxide semiconductor TFT as claimed in claim 14, wherein in Step 2, the bending operation stretches the oxide semiconductor layer so that the threshold voltage of the oxide semiconductor TFT is reduced and gradually stabilized.

16. The method for improving threshold voltage of oxide semiconductor TFT as claimed in claim 14, wherein in Step 2, the bending operation compresses the oxide semiconductor layer so that the threshold voltage of the oxide semiconductor TFT is increased and gradually stabilized.

17. The method for improving threshold voltage of oxide semiconductor TFT as claimed in claim 14, wherein the oxide semiconductor layer is made of indium gallium zinc oxide (IGZO).

18. The method for improving threshold voltage of oxide semiconductor TFT as claimed in claim 14, wherein the gate, the source and the drain are made of one or more of the materials of molybdenum (Mo), aluminum (Al), and titanium (Ti).

19. The method for improving threshold voltage of oxide semiconductor TFT as claimed in claim 14, wherein Step 1 further comprises: providing a flexible base, and the oxide semiconductor TFT being disposed on the flexible base.

* * * * *